(12) United States Patent
Aoki

(10) Patent No.: US 6,717,453 B2
(45) Date of Patent: Apr. 6, 2004

(54) LEVEL SHIFT CIRCUIT HAVING AT LEAST TWO SEPARATE SIGNAL PATHS

(75) Inventor: Mikio Aoki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/245,091

(22) Filed: Sep. 17, 2002

(65) Prior Publication Data

US 2003/0058023 A1 Mar. 27, 2003

(30) Foreign Application Priority Data

Sep. 18, 2001 (JP) ........................................ 2001-282825
Apr. 11, 2002 (JP) ........................................ 2002-109032

(51) Int. Cl.$^7$ ................................................ H03L 5/00
(52) U.S. Cl. ............................ 327/333; 326/63; 326/80
(58) Field of Search .......................... 327/333, 402–404; 326/80, 81, 62–79

(56) References Cited

U.S. PATENT DOCUMENTS 5,666,070 A * 9/1997 Merritt et al. ................. 326/81
6,476,637 B1 * 11/2002 Brownlow et al. ............ 326/81

FOREIGN PATENT DOCUMENTS

| JP | 11-239051 | 8/1999 |
| JP | 2001-68978 | 3/2001 |
| JP | 2001-68991 | 3/2001 |

OTHER PUBLICATIONS

English Bibliographies and Abstracts of JP 2001–68991, JP 2001–68978 and JP 11–239051 (cited above).

* cited by examiner

*Primary Examiner*—Minh Nguyen
(74) *Attorney, Agent, or Firm*—Darryl G. Walker; Bradley T. Sako

(57) ABSTRACT

A level shift circuit (100) that may have reduced input-output timing differences has been disclosed. Level shift circuit (100) may include a level shift portion (1) and a signal selection portion (2). Level shift portion (1) may receive an input signal at an input terminal (A) operating at a first voltage (VDD1) and may provide complementary signals at terminals (14 and 15) operating at a second voltage (VDD2). Signal selection circuit (2) may include a first signal propagation path (23 and 21) for timing an output signal at an output terminal (Y) based on a signal at terminal (14) and a second signal propagation path (22) for timing an output signal at an output terminal (Y) based on a signal at terminal (15). The first signal propagation path may be selected when a signal at terminal (14) transitions from high to low and the second signal propagation path may be selected when a signal at terminal (15) transitions from high to low. In this way, a delay difference caused by differences in timings of a rising edge and a falling edge of a signal may be reduced.

17 Claims, 10 Drawing Sheets

LEVEL SHIFT CIRCUIT HAVING AT LEAST TWO SEPARATE SIGNAL PATHS

TECHNICAL FIELD

The present invention relates generally to a level shift circuit and more particularly to a level shift circuit that may provide an interface between internal circuits of a semiconductor integrated circuit and external circuits and/or between internal circuits of a semiconductor integrated circuit operating from different power supply potentials.

BACKGROUND OF THE INVENTION

A level shift circuit can be used as an interface between circuits operating at different power supply voltages. A level shifter can receive a signal having a first power supply level and provides a signal having a second power supply level. As manufacturing processes become finer and/or lower power consumption becomes desirable, internal circuits of a semiconductor integrated circuit (such as a large scale integrated circuit—LSI) are reduced. However, a semiconductor integrated circuit can be included in a system operating at a higher power supply voltage. In this case, an interface circuit is required to provide an interface between external signals and internal signals having different voltage swings. In systems in which the system voltage has not been stepped down, the difference between the system power supply potential and the power supply potential for internal circuits on a semiconductor integrated circuit can be great. Because different systems may operate at different power supply potentials, the interface circuit needs to operate over a wide range. However, sizing of devices in a level shift circuit may be different for optimal performance at different power supply potentials. Due to the need to provide an interface circuit that operates over such a wide range of power supply potentials, design and development time may be increased.

Also, in order to provide a LSI that can have low power consumption capabilities and/or high speed capabilities as required by the system, a method has been established in which an LSI is operated by changing internal and/or external poser supply voltages during usage as necessary. This has led to a demand that a wide range of internal and external voltages being supported with a single level shift circuit while maintaining operating characteristics (such as delay time). Additionally, in recent years, a complementary signal output has been adopted or a method with which data is sampled/provided by detecting a rising and a falling edge of a clock signal. As a result, in a level shift circuit, it has become increasingly important that differences in delay times occurring when an output signal rises and a delay time when an output signal falls be reduced or eliminated.

Referring to FIG. 9, a circuit schematic diagram of a conventional level shift circuit is set forth and given the general reference character 101.

Conventional level shift circuit 101 includes inverters (111 and 112) and a level shift flip-flop portion 113. Level shift circuit 101 is supplied with power supply voltages (VDD1 and VDD2), where power supply voltage VDD1≦power supply voltage VDD2. Inverter 111 is constructed from n-channel transistor N101 and p-channel transistor P101. Inverter 112 is constructed from n-channel transistor N102 and p-channel transistor P102. Level shifter flip-flop portion 113 is constructed from n-channel transistors (N103 and N104) and p-channel transistors (P103 and P104).

In level shift circuit 101, the drive capabilities of p-channel transistors (P103 and P104) are set to be small and the drive capabilities of n-channel transistors (N103 and N104) are set to be large in order to support a wide range of differences between internal and external voltages. In order to support such a wide range of differences, a large difference between driving capabilities are maintained in this manner. However, because of the drive capability differences, a large difference between an input-output delay time (delay time between an input signal at terminal A and an output signal at terminal Y) occurs between an input-output delay time for a rising edge signal and a falling edge signal.

In order to reduce such a difference between input-output delay times, JP 2001-068991 A and JP 11-239051 A disclose level shift circuits where an output terminal of the level shift circuit is provided with a pull-up circuit.

Referring now to FIG. 10, a circuit schematic diagram of a conventional level shift circuit as disclosed in JP 2001-068991 A is set forth. The conventional level shift circuit of FIG. 10 includes a level shift portion 101 (identical to level shift circuit 101 of FIG. 9) and a pull-up portion 102. Pull-up portion 102 includes p-channel transistors (P121 and P122) and inverters (121 and 122).

Referring now to FIG. 11, a circuit schematic diagram of a conventional level shift circuit as disclosed in JP 2001-239051 A is set forth. The conventional level shift circuit of FIG. 11 includes a level shift portion 101 (identical to level shift circuit 101 of FIG. 9) and a pull-up portion 102a. Pull-up portion 102a includes p-channel transistors (P123 and P124) and inverters (123 and 124).

In conventional level shift circuits illustrated in FIGS. 10 and 11, by providing pull-up portions (102 and 102a), it may be possible to improve an input-output delay time in the case of a rising output signal.

However, the conventional level shift circuit disclosed in JP 2001-068991 A (FIG. 10) has a drawback in that if a potential difference between power supply voltage VDD1 and power supply voltage VDD2 is increased, the effect of pull-up portion 102 is reduced and the difference between input-output delay times are increased. Also, the conventional level shift circuit disclosed in JP 11-239051 A (FIG. 11) has a drawback that if the power supply voltage VDD2 fluctuates, the pull-up capabilities of pull-up portion 102a also varies which causes the difference between input-output delay times to vary.

Also, in conventional level shift portion 101, the delay time difference tends to vary in accordance with the fluctuations of power supply voltages. When power supply voltage VDD1 fluctuates the gate to source voltage (Vgs) of n-channel transistors (N103 and N104) vary and the drive capabilities of n-channel transistors (N103 and N104) vary accordingly. Consequently, a delay time occurring when the potential of a terminal (114 or 115) switches from a logic high level to a logic low level varies. On the other hand, when power supply voltage VDD2 fluctuates, the gate to source voltages (Vgs) of p-channel transistors (P103 and P104) vary and the drive capabilities of p-channel transistors (P103 and P104) vary accordingly. Consequently, a delay time occurring when the potential of terminal (114 or 115) switches from a logic low level to a logic high level varies.

For the reasons described above, an input-output delay time for both a rising output signal and a falling output signal can vary in accordance with variations in power supply voltages (VDD1 and VDD2). Also, the difference between the delay times between a rising output signal and a falling output signal varies in accordance with variations in power supply voltages (VDD1 and VDD2). As a result, conventional level shift circuits have a drawback in that when an internal power supply voltage or an external power supply voltage fluctuates, it may be difficult to reduce a difference between an input-output delay time between a rising output signal and a falling output signal.

In view of the above discussion, it would be desirable to provide level shift circuit that may be capable of improving delay time characteristics and reducing a difference between delay times even if a power supply voltage fluctuates over a wide range.

SUMMARY OF THE INVENTION

According to the present embodiments, a level shift circuit that may have reduced input-output timing differences is disclosed. A level shift circuit may include a level shift portion and a signal selection portion. A level shift portion may receive an input signal at an input terminal operating at a first voltage and may provide complementary signals at terminals operating at a second voltage. A signal selection circuit may include a first signal propagation path for timing an output signal at an output terminal based on a signal at one terminal and a second signal propagation path for timing an output signal at an output terminal based on a signal at another terminal. The first signal propagation path may be selected when a signal at one terminal transitions from high to low and the second signal propagation path may be selected when a signal at another terminal transitions from high to low. In this way, a delay difference caused by differences in timings of a rising edge and a falling edge of a signal may be reduced.

According to one aspect of the embodiments, a level shift circuit may be supplied with a first power supply potential, a second power supply potential, and a reference potential and may convert an input signal having a first potential swing to an output signal having a second potential swing. The first potential swing may be essentially a potential difference between the first power supply potential and the reference potential. The second potential swing may be essentially a potential difference between the second power supply potential and the reference potential. The level shift circuit may include a level shift portion and a signal selection portion. The level shift portion may receive the input signal and may generate first and second signals. The first and second signals may have complementary logic levels and may have the second potential swing. The signal selection portion may receive the first and second signals and may provide the output signal. The output signal may have a transition based on the first signal when the first signal transitions from a high logic level to a low logic level and based on the second signal when the second signal transitions from the high logic level to the low logic level.

According to another aspect of the embodiments, the level shift portion may include a first node, a second node, a first inverter, a first p-channel transistor, a second p-channel transistor, a first n-channel transistor, and a second n-channel transistor. The first signal may be provided at the first node and the second signal may be provided at the second node. The first inverter may be supplied with the first power supply potential and the reference potential. The first inverter may receive the input signal and may generate an inverted signal having the first potential swing. The first p-channel transistor may have a source connected to the second power supply potential, a gate connected to the second node, and a drain connected to the first node. The second p-channel transistor may have a source connected to the second power supply potential, a gate connected to the first node, and a drain connected to the second node. The first n-channel transistor may have a drain connected to the first node, a gate connected to receive the inverted signal, and a source connected to the reference potential. The second n-channel transistor may have a drain connected to the second node, a gate connected to receive the input signal, and a source connected to the reference potential.

According to another aspect of the embodiments, the level shift portion may include a first node, a second node, a first inverter, a first p-channel transistor, a second p-channel transistor, a third p-channel transistor, a fourth p-channel transistor, a first n-channel transistor, and a second n-channel transistor. The first signal may be provided at the first node and the second signal may be provided at the second node. The first inverter may be supplied with the first power supply potential and the reference potential. The first inverter may receive the input signal and may generate an inverted signal having the first potential swing. The first p-channel transistor may have a source connected to the second power supply potential, a gate connected to the third node, and a drain connected to a fourth node. The second p-channel transistor may have a source connected to the second power supply potential, a gate connected to the fourth node, and a drain connected to the third node. The third p-channel transistor may have a source connected to the third node, a gate connected to a third power supply potential, and a source connected to the first node. The fourth p-channel transistor may have a source connected to the fourth node, a gate connected to a third power supply potential, and a source connected to the second node. The first n-channel transistor may have a drain connected to the first node, a gate connected to receive the inverted signal, and a source connected to the reference potential. The second n-channel transistor may have a drain connected to the second node, a gate connected to receive the input signal, and a source connected to the reference potential.

According to another aspect of the embodiments, the signal selection portion may include an output terminal, a first inverter, a first clocked inverter, a second clocked inverter, and a logic circuit. The output signal may be received at the output terminal. The first inverter may be supplied with the second power supply potential and may have a first inverter input and a first inverter output. The first inverter input may receive the first signal. The first clocked inverter may be supplied with the second power supply potential and may receive the first inverter output at a first clocked inverter input and a first control signal at a first clocked inverter control terminal. The first clocked inverter may have a first clocked inverter output connected to the output terminal. The second clocked inverter may be supplied with the second power supply potential and may receive the second signal at a second clocked inverter input and the first control signal at a second clocked inverter control terminal. The second clocked inverter may have a second clocked inverter output connected to the output terminal. The logic circuit may generate the first control signal. The first clocked inverter may be in an operation state when the first signal has a high logic level and the second clocked inverter may be placed in the operation state a predetermined time after the first signal transitions to the low logic level. The second clocked inverter may be in an operation state when the second signal has a high logic level and the first clocked inverter may be placed in the operation state a predetermined time after the second signal transitions to the low logic level.

According to another aspect of the embodiments, the first clocked inverter may include a first p-channel transistor, a second p-channel transistor, a first n-channel transistor, and a second n-channel transistor. The second clocked inverter may include a third p-channel transistor, a fourth p-channel transistor, a third n-channel transistor, and a fourth n-channel transistor. The first p-channel transistor may have a source connected to the second power supply potential, a gate connected to receive the first control signal, and a drain connected to a source of the second p-channel transistor. The second p-channel transistor may have a gate connected to the first inverter output and a drain connected to the output terminal. The first n-channel transistor may have a source connected to the output terminal, a gate connected to the first inverter output, and a source connected to a drain of the second n-channel transistor. The second n-channel transistor may have a gate connected to a second control signal and a source connected to the reference potential. The third p-channel transistor may have a source connected to the second power supply potential, a gate connected to receive the second control signal, and a drain connected to a source of the fourth p-channel transistor. The fourth p-channel transistor may have a gate connected to receive the second signal and a drain connected to the output terminal. The third n-channel transistor may have a source connected to the output terminal, a gate connected to receive the second signal, and a source connected to a drain of the fourth n-channel transistor. The fourth n-channel transistor may have a gate connected to the first control signal and a source connected to the reference potential.

According to another aspect of the embodiments, the second signal is received at a second signal terminal. The signal selection portion may include a first inverter, a first transfer gate, and a second transfer gate. The first inverter may be supplied with the second power supply potential and may have a first inverter input and a first inverter output. The first inverter input may receive the first signal. The first transfer gate may be disposed between the first inverter output and the output terminal and may have a first transfer gate control terminal coupled to receive a first control signal. The second transfer gate may be disposed between the second signal terminal and the output terminal and may have a second transfer gate control terminal coupled to receive a first control signal.

According to another aspect of the embodiments, the first transfer gate includes a first p-channel transistor and a first n-channel transistor and the second transfer gate includes a second p-channel transistor and a second n-channel transistor. The first p-channel transistor may have a first source/drain terminal connected to receive the first inverter output, a second source/drain terminal connected to the output terminal, and a gate connected to receive the first control signal. The first n-channel transistor may have a first source/drain terminal connected to receive the first inverter output, a second source/drain terminal connected to the output terminal, and a gate connected to receive a second control signal. The second p-channel transistor may have a first source/drain terminal connected to receive the second signal, a second source/drain terminal connected to the output terminal, and a gate connected to receive the second control signal. The third n-channel transistor may have a first source/drain terminal connected to receive the second signal, a second source/drain terminal connected to the output terminal, and a gate connected to receive the first control signal.

According to another aspect of the embodiments, a level shift circuit may include a level shift portion and a signal selection portion. The level shift portion may receive an input signal and may generate first and second signals. The signal selection portion may include a first signal path circuit and a second signal path circuit. The first signal path circuit may receive the first signal and provide an output signal in response to the first signal transitioning from a first logic level to a second logic level. The second signal path circuit may receive the second signal and provide an output signal in response to the second signal transitioning from the first logic level to the second logic level.

According to another aspect of the embodiments, the level shift circuit may include a control circuit. The control circuit may receive the output signal and provide a control signal to the first signal path circuit and the second signal path circuit. The first signal path circuit may be enabled in response to the output signal having a first output signal logic level and the second signal path may be enabled in response to the output signal having a second output signal logic level.

According to another aspect of the embodiments, the level shift circuit may include a control circuit. The control circuit may receive the first signal and the second signal and provide a control signal to the first signal path circuit and the second signal path circuit. The first signal path may be enabled in response to the first signal having the first logic level and the second signal having the second logic level. The second signal path may be enabled in response to the second signal having the first logic level and the first signal having the second logic level.

According to another aspect of the embodiments, the control circuit may include a flip-flop coupled to receive the first signal and the second signal.

According to another aspect of the embodiments, the first signal may have a first transition time for the first logic level to the second logic level transition and a second transition time for the second logic level to the first logic level transition. The second transition time may be greater than the first transition time.

According to another aspect of the embodiments, the first signal path circuit may include a first clocked inverter and the second signal path circuit may include a second clocked inverter.

According to another aspect of the embodiments, the first signal path circuit may include a first transfer gate and the second signal path circuit may include a second transfer gate.

According to another aspect of the embodiments, a level shift circuit may include a level shift portion and a signal selection portion. The level shift portion may receive an input signal having a first voltage swing and may generate first and second signals having a second voltage swing. The second voltage swing may be greater than the first voltage swing. The second selection portion may include a first signal path circuit and a second signal path circuit. The first signal path circuit may receive the first signal and provide an output signal in response to the first signal transitioning from a first logic level to a second logic level. The second signal path circuit may receive the second signal and provide an output signal in response to the second signal transitioning from the first logic level to the second logic level.

According to another aspect of the embodiments, the level shift circuit may include a control circuit. The control circuit may receive the output signal and provide a signal path control signal. The first signal path circuit may include a first clocked inverter connected to receive the signal path control signal. The second signal path circuit may include a second clocked inverter connected to receive the signal path control signal.

According to another aspect of the embodiments, the level shift circuit may include a control circuit. The control circuit may receive the output signal and provide a signal path control signal. The first signal path circuit may include a first transfer gate connected to receive the signal path control signal. The second signal path circuit may include a second transfer gate connected to receive the signal path control signal.

According to another aspect of the embodiments, the level shift circuit may include a control circuit. The control circuit may receive the first signal and the second signal and provide a signal path control signal. The first signal path circuit may include a first clocked inverter connected to receive the signal path control signal. The second signal path circuit may include a second clocked inverter connected to receive the signal path control signal.

According to another aspect of the embodiments, the level shift circuit may include a control circuit. The control circuit may receive the first signal and the second signal and provide a signal path control signal. The first signal path circuit may include a first transfer gate connected to receive the signal path control signal. The second signal path circuit may include a second transfer gate connected to receive the signal path control signal.

According to another aspect of the embodiments, the level shift circuit may include a control circuit. The control circuit may provide a control signal to the first signal path circuit and the second signal path circuit. The output signal may make a first logic transition in response to the first signal transitioning from a first logic level to a second logic level. The control signal may enable the second signal path circuit and disable the first signal path circuit after the first transition. The output signal may make a second logic transition in response to the second signal transitioning from the first logic level to the second logic level. The control signal may enable the first signal path circuit and disable the second signal path circuit after the second transition.

DETAILED DESCRIPTION OF THE EMBODIMENTS

Various embodiments of the present invention will now be described in detail with reference to a number of drawings.

Figure 1:
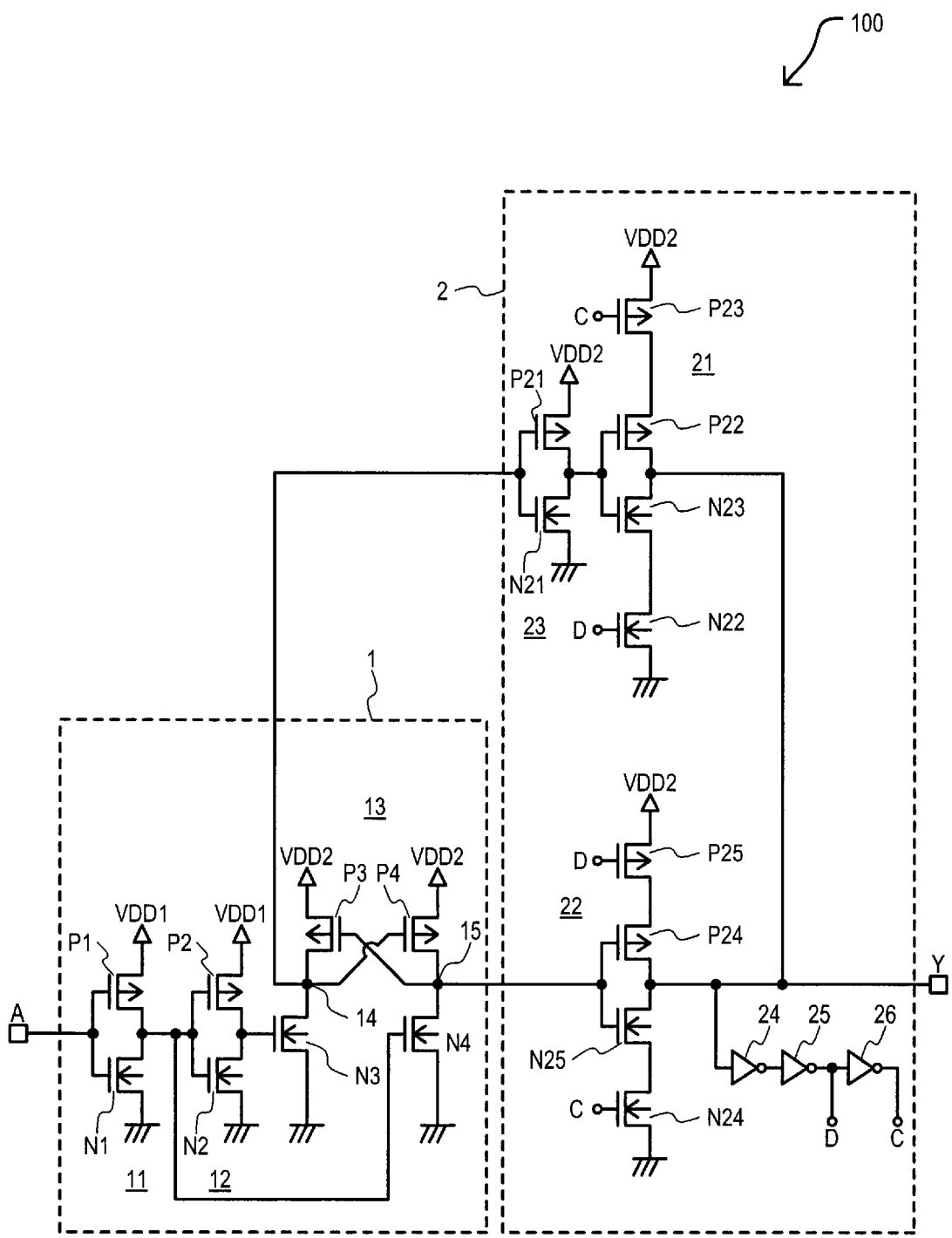
FIG. 1 is a circuit schematic diagram of a level shift circuit according to a first embodiment.

Referring now to FIG. 1, a circuit schematic diagram of a level shift circuit according to an embodiment is set forth and given the general reference character 100.

Level shift circuit 100 may include a level shift portion 1 and a signal selection portion 2.

Level shift portion 1 may include inverters (11 and 12) and a level shifter flip-flop 13. Level shift portion 1 may receive power supply voltages (VDD1 and VDD2), where VDD1≦VDD2. Inverters (11 and 12) may receive power supply voltage VDD1 as a power source. Level shifter flip-flop 13 may receive power supply voltage VDD2 as a power source.

Inverter 11 may include n-channel transistor N1 and p-channel transistor P1. P-channel transistor P1 may have a source connected to power supply voltage VDD1, a gate connected to input terminal A, and a drain connected to a drain of n-channel transistor N1 at an output. N-channel transistor N1 may have a gate connected to input terminal A and a source connected to GND (ground potential).

Inverter 12 may include n-channel transistor N2 and p-channel transistor P2. P-channel transistor P2 may have a source connected to power supply voltage VDD1, a gate connected to an output of inverter 11, and a drain connected to a drain of n-channel transistor N2 at an output. N-channel transistor N2 may have a gate connected to an output of inverter 11 and a source connected to GND.

Level shifter flip-flop 13 may include n-channel transistors (N3 and N4) and p-channel transistors (P3 and P4). P-channel transistor P3 may have a source connected to power supply voltage VDD2, a gate connected to an output terminal 15 and a drain connected to an output terminal 14. P-channel transistor P4 may have a source connected to power supply voltage VDD2, a gate connected to output terminal 14 and a drain connected to output terminal 15. N-channel transistor N3 may have a drain connected to output terminal 14, a gate connected to an output of inverter 12 and a source connected to GND. N-channel transistor N4 may have a drain connected to output terminal 15, a gate connected to an output of inverter 11 and a source connected to GND.

Signal selection portion 2 may include clocked inverter (21 and 22) and inverters (23 to 26). Inverter 23 may have an input connected to output terminal 14 of level shifter flip-flop 13 and may provide an output as an input to clocked inverter 21. Clocked inverter 21 may receive outputs (C and D) from inverters (25 and 26), respectively, and may provide an output to an output terminal Y of level shift circuit 100. Clocked inverter 22 may have inputs connected to output terminal 15 of level shifter flip-flop 13 and outputs (D and C) from inverters (26 and 25), respectively, and may provide an output to output terminal Y. Inverter 24 may have an input connected to output terminal Y and may provide an output to an input of inverter 25. Inverter 25 may have an output D connected to an input of inverter 26. Inverter 26 may provide output C.

Inverter 23 may include a p-channel transistor P21 and an n-channel transistor N21. P-channel transistor P21 may have a source connected to power supply voltage VDD2, a gate connected to an output terminal 14 of level shifter flip-flop 13 and a drain connected to a drain of transistor N21 at an output of inverter 23. N-channel transistor N21 may have a gate connected to an output terminal 14 of level shifter flip-flop 13 and a source connected to GND.

Clocked inverter 21 may include p-channel transistors (P22 and P23) and n-channel transistors (N22 and N23). P-channel transistor P23 may have a source connected to power supply voltage VDD2, a gate connected to output C of inverter 26, and a drain connected to a source of p-channel transistor P22. P-channel transistor P22 may have a gate connected to an output of inverter 23 and a drain connected to output terminal Y. N-channel transistor N23 may have a drain connected to output terminal Y, a gate connected to an output of inverter 23, and a source connected to a drain of n-channel transistor N22. N-channel transistor N22 may have a gate connected to an output D of inverter 25 and a source connected to GND.

Clocked inverter 22 may include p-channel transistors (P24 and P25) and n-channel transistors (N24 and N25). P-channel transistor P25 may have a source connected to power supply voltage VDD2, a gate connected to output D of inverter 25, and a drain connected to a source of p-channel transistor P24. P-channel transistor P24 may have a gate connected to an output terminal 15 of level shifter flip-flop 13 and a drain connected to output terminal Y. N-channel transistor N25 may have a drain connected to output terminal Y, a gate connected to an output terminal 15 of level shifter flip-flop 13, and a source connected to a drain of n-channel transistor N24. N-channel transistor N24 may have a gate connected to an output C of inverter 26 and a source connected to GND.

The operation of level shift circuit 100 will now be described.

First, the operation of level shift portion 1 will be described. When the potential of input terminal A is at a high level (logic high, such as VDD1), the output of inverter 11 may be at a low level and the output of inverter 12 may be at a high level. In this way, n-channel transistor N3 may be turned on and n-channel transistor N4 may be turned off. With n-channel transistor N3 turned on, output terminal 14 of level shifter flip-flop 13 may be pulled to a low level (GND). With output terminal 14 at a low level, p-channel transistor P4 may be turned on. With p-channel transistor P4 turned on, output terminal 15 of level shifter flip-flop 13 may be pulled to a high level (VDD2 in this case). With output, terminal 15 at a high level, p-channel transistor P3 may be turned off.

However, when the potential of input terminal A is at a low level (logic low), the output of inverter 11 may be at a high level and the output of inverter 12 may be at a low level. In this way, n-channel transistor N3 may be turned off and n-channel transistor N4 may be turned on. With n-channel transistor N4 turned on, output terminal 15 of level shifter flip-flop 13 may be pulled to a low level (GND). With output terminal 15 at a low level, p-channel transistor P3 may be turned on. With p-channel transistor P3 turned on, output terminal 14 of level shifter flip-flop 13 may be pulled to a high level (VDD2 in this case). With output terminal 14 at a high level, p-channel transistor P4 may be turned off.

In this way, level shift portion 1 may receive a signal at input terminal A provided by a circuit operating from a first voltage potential VDD1 and may provide an output signal accordingly at output terminals (14 and 15) provided at a second voltage potential VDD2.

Figure 2:
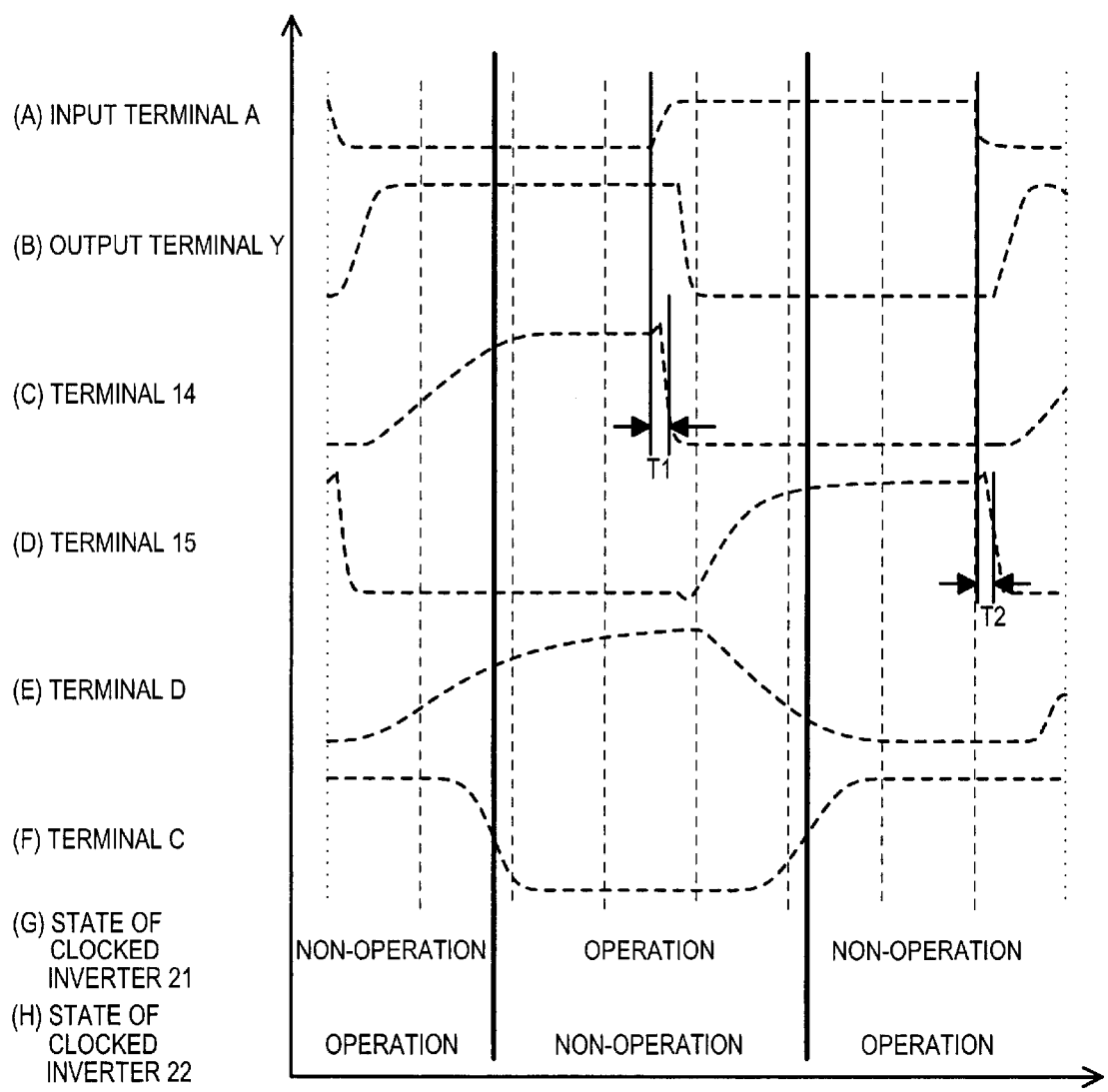
FIG. 2 is a waveform diagram illustrating the operation of the level shift circuit of FIG. 1.

The operation of the entire level shift circuit 100 will now be described with reference to waveforms illustrated in FIG. 2 in conjunction with FIG. 1. FIG. 2 is a waveform diagram illustrating the operation of level shift circuit 100.

Referring now to FIG. 2, an initial state may be set where input terminal A is at a high level. In response to input terminal A at a high level, output terminal Y may be at a low level, terminal 14 may be at a low level, terminal 15 may be at a high level, terminal D may be at a low level, and terminal C may be at a high level.

With terminal D (output of inverter 25) at a low level and terminal C (output of inverter 26) at a high level, clocked inverter 21 may be in a non-operation state (a high impedance state), and clocked inverter 22 may be in an operation state (providing an inverting function).

When the potential of input terminal A changes to a low level, the potential of terminal 14 and the potential of terminal 15 may change to a high level and low level, respectively. The drive capabilities of p-channel transistors (P3 and P4) may be set to be small compared to drive capabilities of n-channel transistors (N3 and N4) in level shift portion 1. Consequently, as shown in FIG. 2, signals at terminals (14 and 15) may be rounded when rising from a low level to a high level.

When the potential of terminal 14 changes to a high level and the potential of terminal 15 changes to a low level, clocked inverter 22 may change the potential of output terminal Y to a high level. With output terminal Y at a high level, terminal D may change to a high level and the potential of terminal C may change to a low level. In response to terminal D being at a high level and terminal C being at a low level, clocked inverter 21 may be in an operation state and clocked inverter 22 may be in a non-operation state.

At this time, inverter 23 and clocked inverter 21 may keep output terminal Y at a high level in response to terminal 14 being at a high level.

Next, when the potential of input terminal A changes from a low level to a high level, the potential of terminal 14 and the potential of terminal 15 may change to a low level and high level, respectively. In response to the potential of terminal 14 being at a low level, inverter 23 may apply a high level to an input of clocked inverter 21. With clocked inverter 21 in an operation state, clocked inverter 21 may apply a low level to output terminal Y. In this way, output terminal Y may transition from a high level to a low level. With output terminal Y at a low level, terminal D may transition to a low level and terminal C may transition to a high level. In response to terminal C being at a high level and terminal D being at a low level, clocked inverter 22 may be in an operation state and clocked inverter 21 may be in a non-operation state.

At this time, clocked inverter 21 may keep output terminal Y at a low level in response to terminal 15 being at a high level.

As described above, in accordance with the embodiment of FIG. 1, output terminal Y may transition in response to either terminal 14 or terminal 15 transitioning from a high level to a low level. Because the sizes of p-channel transistors (P3 and P4) may be essentially the same and the sizes of n-channel transistors (N3 and N4) may be essentially the same, a delay time T1 (see FIG. 2) of terminal 14 transitioning from a high level to a low level in response to a signal transition at input terminal A may be essentially the same as a delay time T2 (see FIG. 2) of terminal 15 transitioning from a high level to a low level in response to a signal transition at input terminal A.

A high to low level transition at terminal 14 may propagate through an inverter 23 and clocked inverter 21. However, a high to low level transition at terminal 15 may only propagate through clocked inverter 22. It may be possible to eliminate delay differences by setting a delay time of clocked inverter 22 to be larger than a delay time of clocked inverter 21 to compensate for the extra gate if necessary.

Accordingly, a difference between an input-output delay time (delay time between a transition at input terminal A and output terminal Y) for a high to low transition at input terminal A and a low to high transition at input terminal A may be reduced or eliminated.

As noted earlier, n-channel transistors (N3 and N4) may have a greater drive strength than p-channel transistors (P3 and P4). Therefore, because a transition of an output signal at output terminal Y may be dependent upon a high to low transition at either terminal 14 or terminal 15, the overall operating speed of level shift circuit 100 may be improved.

In order to perform an operation for reliably driving output terminal Y in response to a falling signal at either terminal 14 or terminal 15 of level shift portion 1, it may be desirable for the states of clocked inverters (21 and 22) to remain fixed until a signal at output terminal Y has completed a transition. For this reason, signals at terminals (D and C) may be delayed by using inverter chain (inverters 24 to 26) in order to prevent a situation where the states of clocked inverters (21 and 22) change before a signal at output terminal Y has completed a transition. This affect may be seen in FIG. 2 by viewing the logic changes at terminals (D and C) being delayed until output terminal Y has completed a logic transition.

Also, in accordance with the embodiment of FIG. 1, even if power supply voltages (VDD1 and VDD2) fluctuate, the difference between an input-output delay time for a high to low transition at input terminal A and a low to high transition at input terminal A may not vary. As noted earlier, level shift portion 1 may have a delay time that varies with fluctuations in power supply voltages (VDD1 and VDD2). That is, in a case where power supply voltage VDD1 fluctuates, gate-source voltages (Vgs) of n-channel transistors (N3 and N4) may fluctuate and the drive capabilities of n-channel transistors (N3 and N4) may vary. As a result, the delay time occurring between a transition at input terminal A and a high to low transition at terminal (14 or 15) may vary.

When power supply voltage VDD2 fluctuates, the gate-source voltages (Vgs) of p-channel transistors (P3 and P4) may fluctuate and the drive capabilities of p-channel transistors (P3 and P4) may vary. As a result, the timing of the rising edges of a signal at terminal 14 or terminal 15 may vary.

Due to the above-described affects, a delay time Ti between the rising edge of a signal provided at input terminal A and a falling edge of a signal at terminal 14 and a delay time T2 between the falling edge of a signal provided at input terminal A and a falling edge of a signal at terminal 15 may vary.

When the size of n-channel transistor N3 is essentially the same as that of n-channel transistor N4 and the size of p-channel transistor P3 is essentially the same as that of p-channel transistors P4 in level shift portion 1, delay time T1 and delay time T2 may vary in a similar manner in accordance with the fluctuations of power supply voltages (VDD1 and VDD2). For example, if delay time T1 increases, delay time T2 may increase by essentially the same amount. As a result, a difference between delay time T1 and delay time T2 may be maintained as a small amount over a wide range of power supply voltages (VDD1 and VDD2).

As described above in accordance with the embodiment of FIG. 1, essentially no difference may occur between an input-output delay time for a low to high output signal and a high to low output signal.

Also in accordance with the embodiment of FIG. 1, even if power supply voltages (VDD1 and VDD2) fluctuate, it may be possible to reduce a range between a maximum value and a minimum value of an input-output delay time in comparison with a conventional level shift circuit. In a conventional level shift circuit, such as conventional level shift circuit of FIGS. 9 to 11, an output terminal Y is driven using a high to low transition and a low to high transition at terminal 115. As a result, the rounding of the waveform at terminal 115 due to a weak pull-up of a p-channel transistor P104 can increase an input-output delay time in a low to high transition and cause a relatively large difference of an input-output delay time compared to a high to low transition case.

However, in the embodiment of FIG. 1, a high to low transition of a signal at terminal 14 or at terminal 15 of level shift portion 1 may be used to trigger a transition of an output signal at output terminal Y. In this way, waveform rounding (due to weak p-channel transistors) may not influence an input-output delay time of level shift circuit 100. Thus, the input-output delay time may be reduced.

Figure 9:
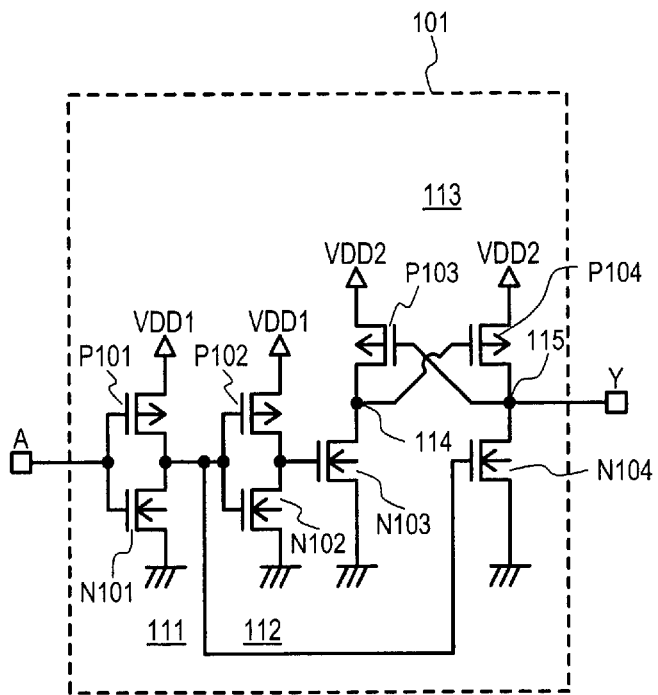
FIG. 9 is a circuit schematic diagram of a conventional level shift circuit.
Figure 10:
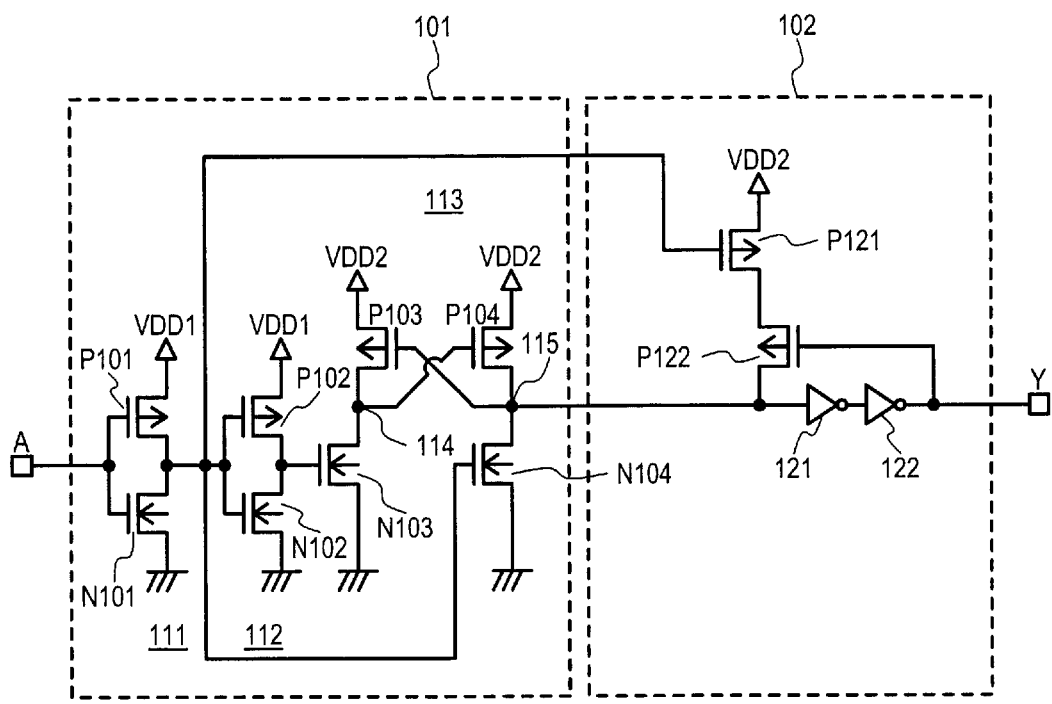
FIG. 10 is a circuit schematic diagram of a conventional level shift circuit.
Figure 11:
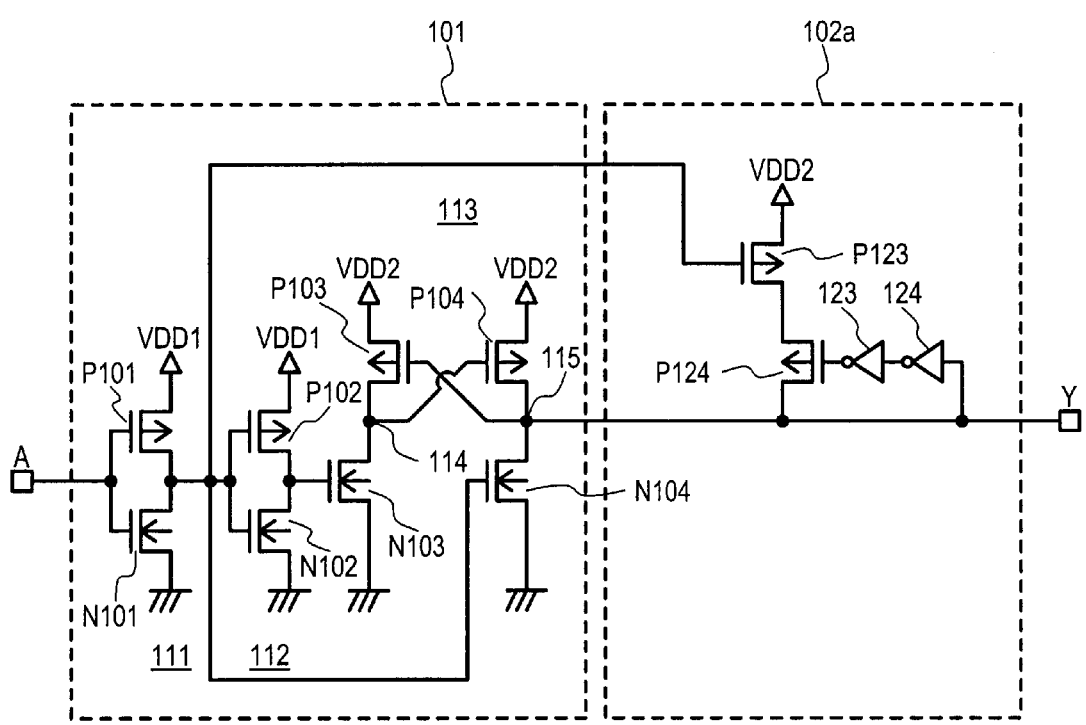
FIG. 11 is a circuit schematic diagram of a conventional level shift circuit.

Delay time characteristics of level shift circuit 100 of FIG. 1, conventional level shift circuit (first conventional example) of FIG. 9, conventional level shift circuit (second conventional example) of FIG. 10, and conventional level shift circuit (third conventional example) of FIG. 11 are shown below in Table 1. Table 1 shows minimum values and maximum values of input-output delay time differences (between rising and falling edge transitions) and minimum values and maximum values of input-output delay times in a case where power supply voltage VDD1 is changed in a range of 0.9 V to 1.4 V and power supply voltage VDD2 is changed in a range of 1.4 V to 3.5 V.

Input-output delay time differences and input output delay times are given in picoseconds (psec). Each input-output delay time difference may be obtained by subtracting an input-output delay time occurring in a case where an output signal falls to a low level from an input-output delay time occurring in a case where an output signal rises to a high level.

TABLE I

|  | Level shift circuit 100 | First Conventional Example | Second Conventional Example | Third Conventional Example |
| --- | --- | --- | --- | --- |
| Input-output delay time difference | −43−−9 | 411–1600 | −432–525 | 117–397 |
| Input-output delay time | 215–589 | 67–1690 | 566–2111 | 74–581 |

As can be seen from Table 1, level shift circuit 100 may have a delay time characteristic that is more consistent for internal and external power supply voltage values over a wide range in comparison with conventional level shift circuits.

Figure 3:
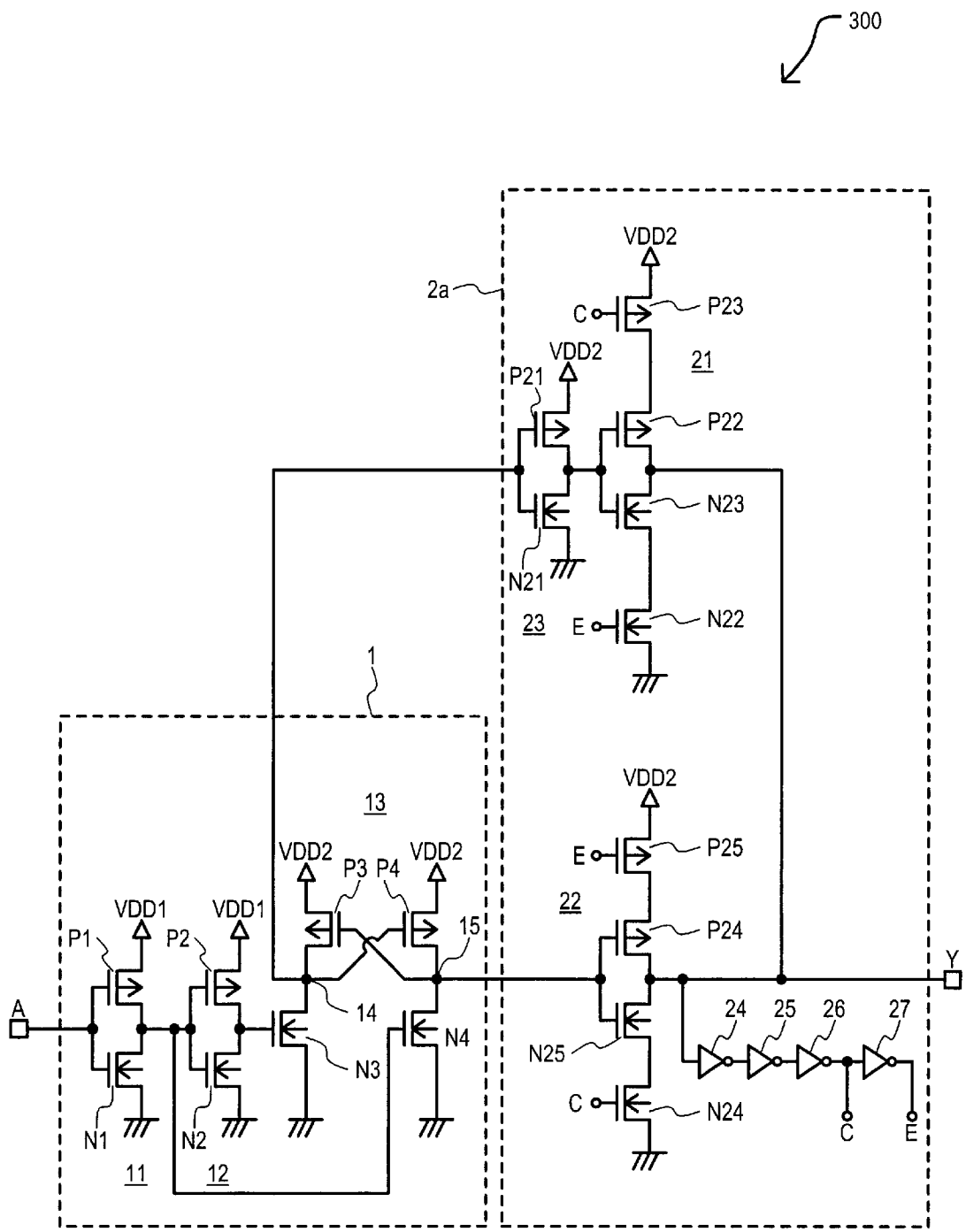
FIG. 3 is a circuit schematic diagram of a level shift circuit according to a second embodiment.
Figure 4:
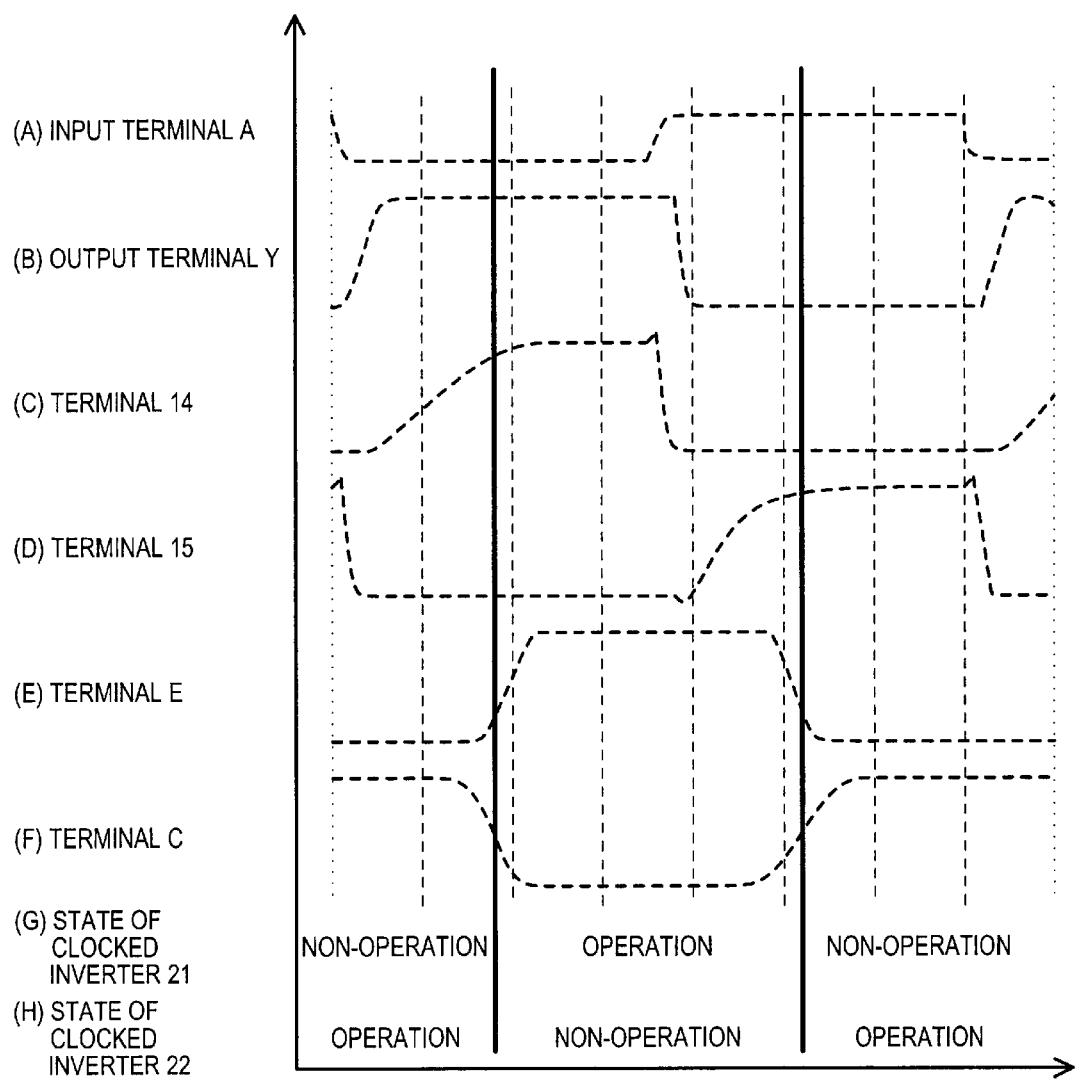
FIG. 4 is a waveform diagram illustrating the operation of the level shift circuit of FIG. 3.

Referring now to FIG. 3, a circuit schematic diagram of a level shift circuit according to a second embodiment is set forth and given the general reference character 300. Level shift circuit 300 may include similar constituents as level shift circuit 100. Such constituents may be referred to by the same reference character. FIG. 4 is a waveform diagram illustrating the operation of level shift circuit 300.

Level shift circuit 300 may include a level shift portion 1 and a signal selection portion 2a. Level shift portion 1 may be the same as level shift portion 1 of level shift circuit 100 previously described with reference to FIG. 1.

However, level shift circuit 300 may differ from level shift circuit 100 in that signal selection portion 2a may include clocked inverters (21 and 22) that may be controlled in a different manner. Signal selection portion 2a may differ from signal selection portion 2 of level shift circuit 100 in that an inverter 27 may be included. Inverter 27 may have an input connected to terminal C (an output of inverter 26) and may have an output connected to terminal E. Terminal E may be connected to a gate of p-channel transistor P25 and a gate of n-channel transistor N22.

By providing inverter 27, the signal waveform provided at a gate of p-channel transistor P25 and a gate of n-channel transistor N22 may have less rounding than in the case of level shift circuit 100. This affect can be seen by comparing the waveform of terminal E in FIG. 4 with the wavefonn of terminal D in FIG. 2. Accordingly, it may be possible to more accurately regulate the operation/non-operation timings of clocked inverters (21 and 22) of level shift circuit 300 as compared to level shift circuit 100.

As described above, by including inverter 27 the operation/non-operation timings of clocked inverters (21 and 22) of level shift circuit 300 may be more accurately controlled. By reducing the transition time of a signal at terminal E as compared to a signal at terminal D (in FIG. 1), clocked inverters (21 and 22) may be more abruptly turned on or turned off. By doing so, a time in which clocked inverters (21 and 22) may provide conflicting current paths may be reduced. Thus, current consumption and overall power consumption may be reduced.

As described above, in addition to the affects described above for level shift circuit 100, level shift circuit 300 may provide better control of operation/non-operation timings of clocked inverters (21 and 22) and thereby reduce power consumption. In level shift circuit 300, it may also be possible to control operation/non-operation timings of clocked inverters (21 and 22) as necessary by adding additional inverters similar to inverter 27 accordingly.

Similar effects (such as reducing delay time differences, for example) may be obtained as in level shift circuits (100 and 300) when other level shift portions including inverted outputs having differing timings in a rising output signal and a falling output signal.

Figure 5:
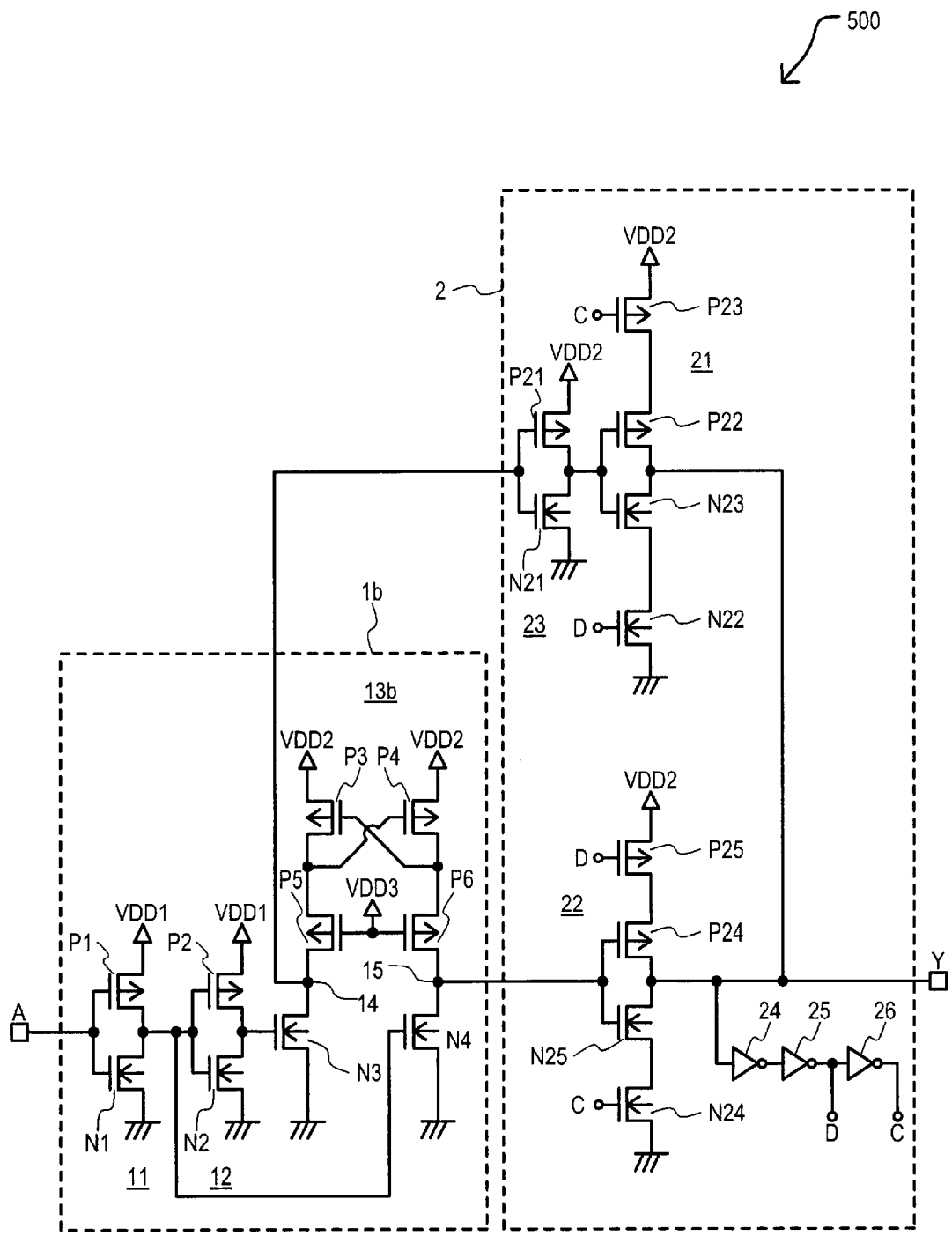
FIG. 5 is a circuit schematic diagram of a level shift circuit according to a third embodiment.

Referring now to FIG. 5, a circuit schematic diagram of a level shift circuit according to a third embodiment is set forth and given the general reference character 500. Level shift circuit 500 may include similar constituents as level shift circuit 100. Such constituents may be referred to by the same reference character.

Level shift circuit 500 may include a level shift portion 1b and a signal selection portion 2. Level shift portion 1b may be the same as a level shift portion disclosed in JP 2001-068978 A. Signal selection portion 2 may be the same as signal selection portion 2 of level shift circuit 100 previously described with reference to FIG. 1.

Level shift portion 1b of level shift circuit 500 may differ from level shift portion 1 previously described with reference to FIG. 1 in that level shifter flip-flop 13 may be replaced with level shifter flip-flop 13b.

Level shifter flip-flop 13b may include p-channel transistors (P3, P4, P5, and P6) and n-channel transistors (N3 and N4). P-channel transistor P3 may have a source connected to power supply potential VDD, a gate connected to a common connection of drain of p-channel transistor P4 and a source of p-channel transistor P6, and a drain connected to a common connection of a gate of p-channel transistor P4 and a source of p-channel transistor P5. P-channel transistor P5 may have a gate connected to a power supply voltage VDD3 and a drain connected to terminal 14. P-channel transistor P6 may have a gate connected to a power supply voltage VDD3 and a drain connected to terminal 15. N-channel transistor N3 may have a drain connected to terminal 14, a gate connected to receive an output of inverter 12, and a source connected to GND. N-channel transistor N4 may have a drain connected to terminal 15, a gate connected to receive an output of inverter 11, and a source connected to GND.

Power supply voltages (VDD1, VDD2, and VDD3) may have a relationship such that VDD2>VDD3>VDD1.

A brief description of the operation level shift portion 1b will now be given.

When the potential of input terminal A is at a high level, inverter 11 may apply a low level (GND) to a gate of n-channel transistor N4 and inverter 12 may apply a high level (VDD1) to a gate of n-channel transistor N3. In this way, n-channel transistor N4 may be turned off and n-channel transistor N3 may be turned on. As a result, p-channel transistors (P3 and P5) may be turned off and p-channel transistors (P4 and P6) may be turned on and terminal 14 may be at a low level and terminal 15 may be at a high level.

When the signal at input terminal A makes a high to low transition, n-channel transistor N4 may be turned on and n-channel transistor N3 may be turned off. At this time, n-channel transistor N4, p-channel transistor P6, and p-channel transistor P4 may all be turned on. However, n-channel transistor N4 may have a greater driving capability than p-channel transistor P4 so that the gate of transistor P3 may be pulled to a low enough voltage to turn on p-channel transistor P3. With p-channel transistor P3 turned on, the gate of p-channel transistor P4 may be turned off. As a result terminal 15 may be pulled to a low level (GND).

P-channel transistor P6 may be provided to limit a low voltage at a drain of p-channel transistor P4 and a gate of p-channel transistor P3. As the drain of p-channel transistor P6 becomes essentially a threshold voltage above power supply potential VDD3, p-channel transistor P6 may turn off. In this way, a gate-source voltage of p-channel transistor P3 may remain relatively low. Likewise, p-channel transistor P5 may be provided to limit a low voltage at a drain of p-channel transistor P3 and a gate of p-channel transistor P4. This may improve the ability to improve drive ratios between p-channel transistors and n-channel transistors without making it necessary to provide n-channel transistors (for example N3 and N4) having large sizes. When sizes of n-channel transistors (N3 and N4) are reduced, gate capacitance may be reduced and therefore operation speeds may be improved.

As described above, the main object of the level shift circuit disclosed in JP 2001-068978 A is to prevent the necessity of having large transistor sizes for n-channel transistors (N3 and N4). However, this does not solve the problem of different input-output delay times for a rising signal at a terminal (14 or 15) and a falling signal at a terminal (14 or 15).

In view of this problem, signal selection portion 2 of the embodiments may be combined with level shift portion 1b disclosed in JP 2001-068978 A. In this way, the difference between input-output delay times may be reduced. The embodiment of FIG. 5 may include the advantageous effect disclosed in JP 2001-068978 A that large transistor sizes may be avoided.

One or both of clocked inverters (21 and 22) illustrated in the first to third embodiments may be changed to transfer gates.

Figure 6:
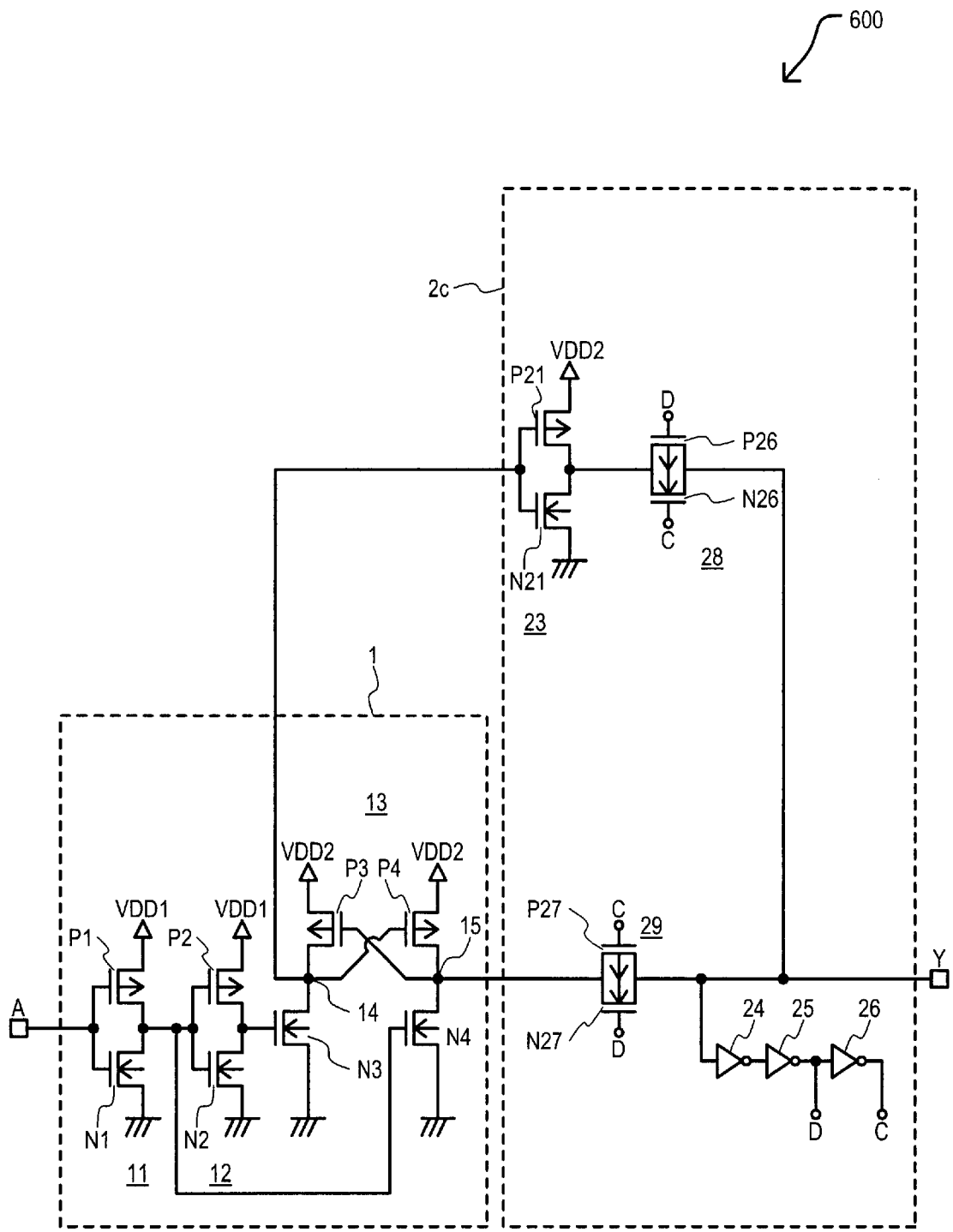
FIG. 6 is a circuit schematic diagram of a level shift circuit according to a fourth embodiment.

Referring now to FIG. 6, a circuit schematic diagram of a level shift circuit according to a fourth embodiment is set forth and given the general reference character 600. Level shift circuit 600 may include similar constituents as level shift circuit 100. Such constituents may be referred to by the same reference character.

Level shift circuit 600 may include a level shift portion 1 and a signal selection portion 2c. Level shift portion 1 may be the same as level shift portion 1 of level shift circuit 100 previously described with reference to FIG. 1.

However, level shift circuit 600 may differ from level shift circuit 100 in that signal selection portion 2c may include transfer gates (28 and 29) instead of clocked inverters (21 and 22). Transfer gate 28 may replace clocked inverter 21 and transfer gate 29 may replace clocked inverter 22.

Transfer gate 28 may include n-channel transistor N26 and p-channel transistor P26. N-channel transistor N26 may have a first source/drain connected to an output of inverter 23, a second source drain connected to output terminal Y, and a gate connected to terminal C. P-channel transistor P26 may have a first source/drain connected to an output of inverter 23, a second source drain connected to output terminal Y, and a gate connected to terminal D.

Transfer gate 29 may include n-channel transistor N27 and p-channel transistor P27. N-channel transistor N27 may have a first source/drain connected to terminal 15, a second source drain connected to output terminal Y, and a gate connected to terminal D. P-channel transistor P27 may have a first source/drain connected to terminal 15, a second source drain connected to output terminal Y, and a gate connected to terminal C.

The operation of level shift circuit 600 will be briefly described.

Assuming initially, a high level is applied to input terminal A. Terminal 14 may be at a low level and terminal 15 may be at a high level. Also, terminal C may be a low level and terminal D may be a high level. Under these conditions, transfer gate 28 may be placed in a non-conductive state (turned off) and transfer gate 29 may be in a conductive state (turned on). With transfer gate 29 turned on, the potential at terminal 15 may be passed to output terminal Y and output terminal Y may be at a high level.

When the signal at input terminal A transitions to a low level, the potential at terminal 14 may transition to a high level and the potential at terminal 15 may transition to a low level. With transfer gate 29 turned on, output terminal Y may transition to a low level and terminals (D and C) may transition to a low level and high level, respectively. In response to the low level at terminal D and high level at terminal C, transfer gate 28 may turn on and transfer gate 29 may turn off. With terminal 14 at a high level, inverter 23 may provide a low level to output terminal Y through turned on transfer gate 28.

Then, when the signal at input terminal A transitions to a high level, the potential at terminal 14 may transition to a low level and the potential at terminal 15 may transition to a high level. With transfer gate 28 turned on, output terminal Y may transition to a high level (through inverter 23 and transfer gate 28) and terminals (D and C) may transition to a high level and low level, respectively. In response to the high level at terminal D and low level at terminal C, transfer gate 29 may turn on and transfer gate 28 may turn off. In this way, the high level of terminal 15 may be provided to output terminal Y through turned on transfer gate 29.

A first signal path in signal selection portion 2c may include an inverter 23 and a transfer gate 28 while a second signal path in signal selection portion 2c may only include transfer gate 29. However, any delay difference between an input-output delay when the first signal path is used as compared to when the second signal path is used may be compensated by setting transfer gate 29 to have a larger delay than transfer gate 28, as just one example. This may be accomplished by setting sizes of transistors (P26 and N26) and transistors (P27 and N27) accordingly.

As described above, level shift circuit 600 may include a level shift portion 1 which may provide a complementary output at terminal (14 and 15). A signal selection portion 2c may select a signal from terminal 14 or terminal 15 so that a high to low transitioning signal may determine the timing of an output signal Y. In this way, input-output propagation delay time variations may be reduced.

It should be noted that level shift circuit 600 may produce a logic level at output terminal Y that is the same as the logic level received at input terminal A. In comparison, level shift circuits (100, 300, and 500) may produce a logic level at output terminal Y that is inverted from the logic level received at input terminal A. However, non-inverted logic may be achieved in any of level shift circuits (100, 300, and 500), for example, by placing inverter 23 between terminal 15 and clocked inverter 22 instead of between terminal 14 and clocked inverter 21. Likewise, inverted logic may be achieved in level shift circuit 600, for example, by placing inverter 23 between terminal 15 and transfer gate 29 instead of between terminal 14 and transfer gate 28.

Figure 7:
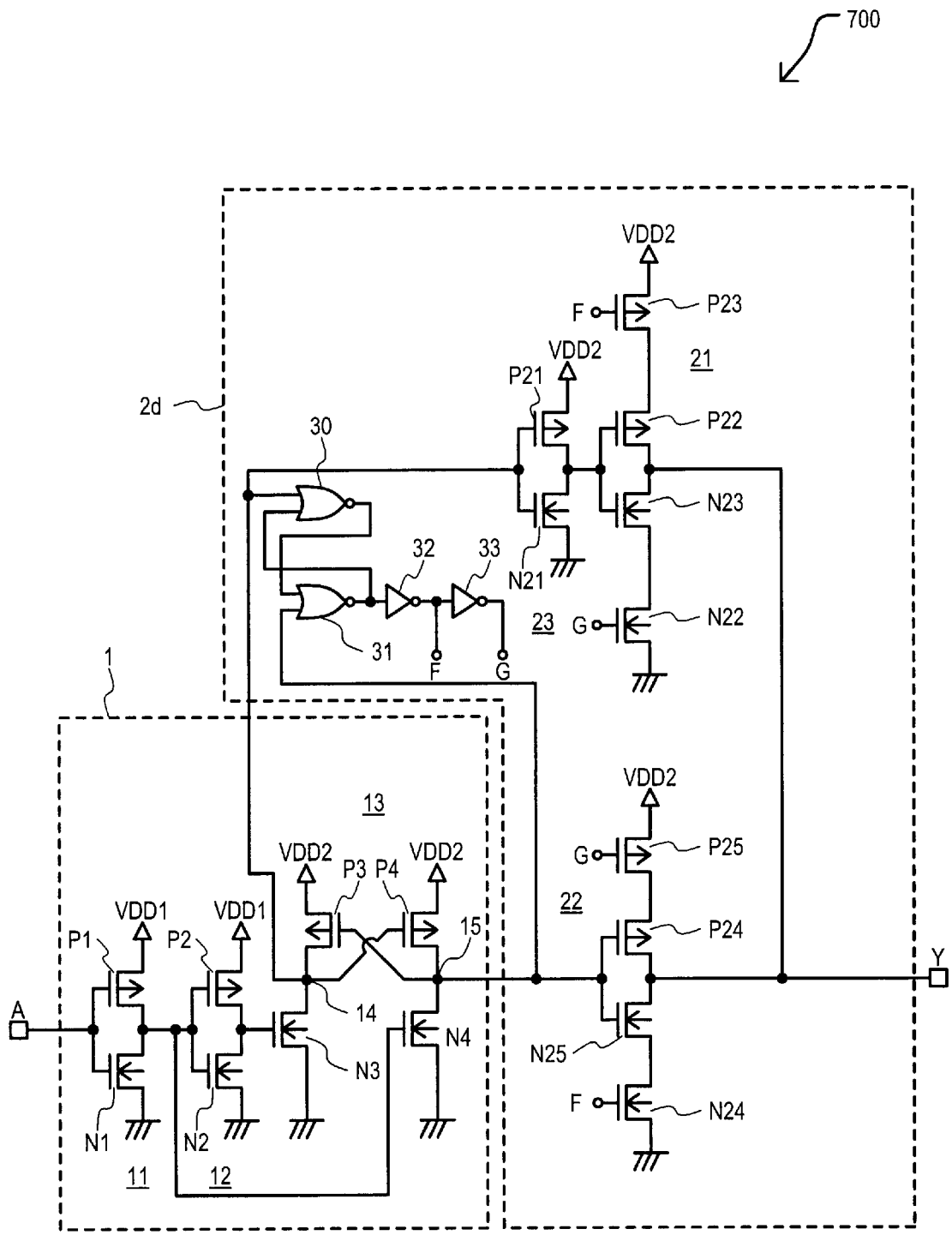
FIG. 7 is a circuit schematic diagram of a level shift circuit according to a fifth embodiment.

Referring now to FIG. 7, a circuit schematic diagram of a level shift circuit according to a fifth embodiment is set forth and given the general reference character 700. Level shift circuit 700 may include similar constituents as level shift circuit 100. Such constituents may be referred to by the same reference character.

Level shift circuit 700 may include a level shift portion 1 and a signal selection portion 2d. Level shift portion 1 may be the same as level shift portion 1 of level shift circuit 100 previously described with reference to FIG. 1.

However, level shift circuit 700 may differ from level shift circuit 100 in that signal selection portion 2d may include clocked inverters (21 and 22) that may be controlled in a different manner. Signal selection portion 2d may differ from signal selection portion 2 of level shift circuit 100 in that NOR gates (30 and 31) and inverters (32 and 33) may be included while inverters (24, 25, and 26) of FIG. 1 may be eliminated.

NOR gate 30 may have a first input terminal connected to terminal 14, a second input terminal connected to an output terminal of NOR gate 31, and may have an output terminal connected to a first input terminal of NOR gate 31. NOR gate 31 may have a second input terminal connected to terminal 15 and an output terminal connected to an input terminal of inverter 32. Inverter 32 may have an output connected to terminal F. Inverter 33 may have an input connected to terminal F and an output connected to terminal G. P-channel transistor P23 may have a gate connected to terminal F and n-channel transistor N22 may have a gate connected to terminal G. P-channel transistor P25 may have a gate connected to terminal G and n-channel transistor N24 may have a gate connected to terminal F.

Level shift circuit 700 may generate control signals (terminal F and terminal G) for clocked inverters (21 and 22) from terminals (14 and 15). In this way, it may be possible to regulate operation/non-operation timings of clocked inverters (21 and 22) without affects, which may be caused by loading at output terminal Y. Also, by eliminating inverter 24 (FIG. 1), the load at output terminal Y may be reduced and transition times of a signal at output terminal Y may be improved so that overall operating speeds may increase.

In the first embodiment (level shift circuit 100), for example, there may be a possibility that when an extremely large difference between the delay time occurring when a potential at a terminal (14 or 15) falls and a potential at the other terminal (15 or 14) rises, the states of clocked inverters (21 and 22) may change to select the terminal (14 or 15) having the high potential too early. In this case, a glitch may occur at output terminal Y.

Level shift circuit 700 may eliminate the possibility of the occurrence of this glitch at output terminal Y. By including NOR gates (30 and 31) to generate control signals at terminals (F and G), switching over the operation/non-operation states of clocked inverters (21 and 22) may not occur until a potential at a terminal (14 or 15) changes from a low level to a high level. In other words, NOR gates (30 and 31) may form a latch, such that a state of control signals at terminal (F and G) may be stored until a potential at a terminal (14 or 15) transitions from a low level to a high level. In this way, signal selection portion 2d may prevent selecting a signal before a transition to the desired logic level has occurred and glitches at output terminal Y may be prevented.

NOR gates (30 and 31) may form a flip-flop circuit.

Figure 8:
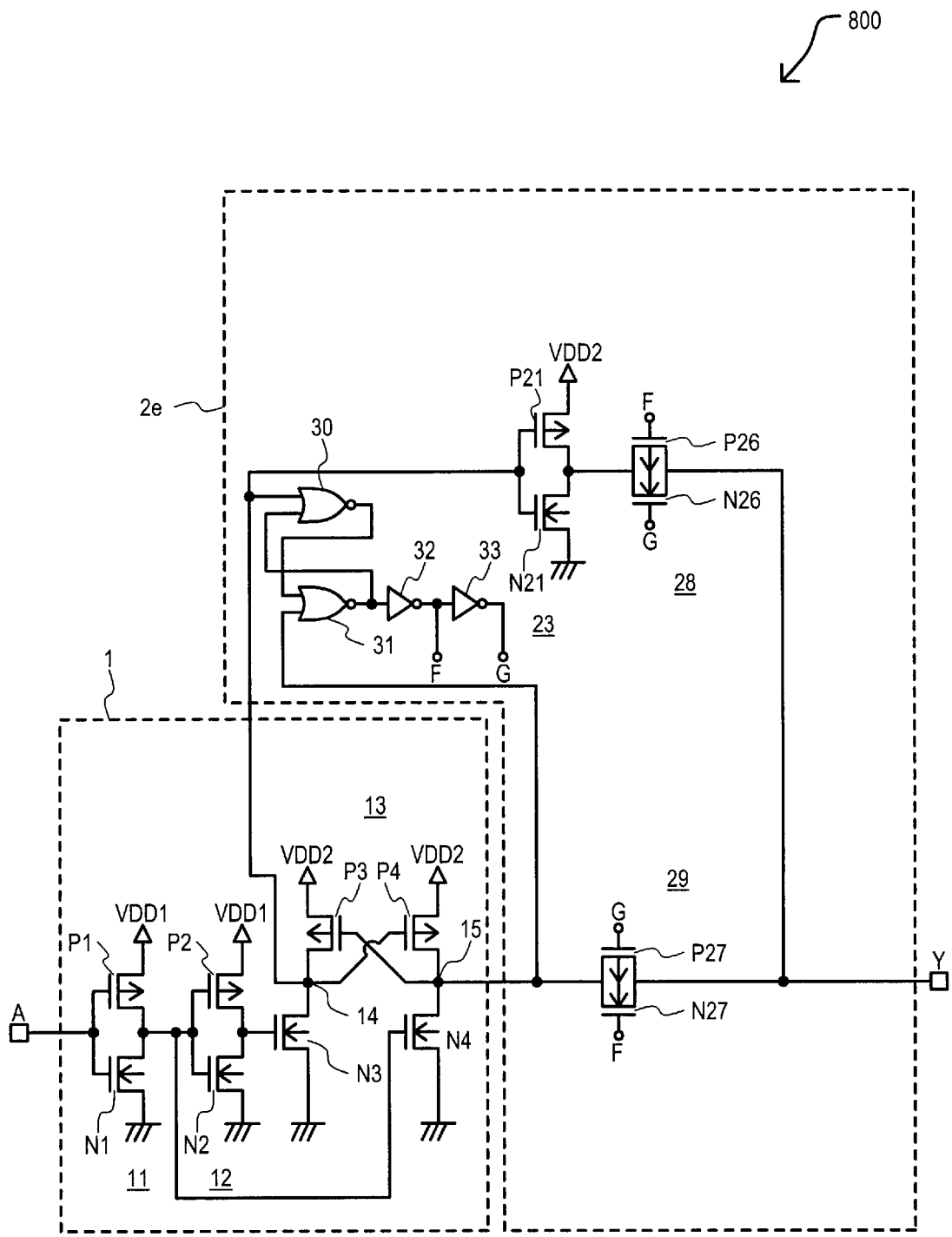
FIG. 8 is a circuit schematic diagram of a level shift circuit according to a sixth embodiment.

Referring now to FIG. 8, a circuit schematic diagram of a level shift circuit according to a sixth embodiment is set forth and given the general reference character 800. Level shift circuit 800 may include similar constituents as level shift circuit 100. Such constituents may be referred to by the same reference character.

Level shift circuit 800 may include a level shift portion 1 and a signal selection portion 2e. Level shift portion 1 may be the same as level shift portion 1 of level shift circuit 100 previously described with reference to FIG. 1.

However, level shift circuit 800 may differ from level shift circuit 100 in that signal selection portion 2e may include transfer gates (28 and 29) instead of clocked inverters (21 and 22). Transfer gate 28 may replace clocked inverter 21 and transfer gate 29 may replace clocked inverter 22. Furthermore, signal selection portion 2e may differ from signal selection portion 2 of level shift circuit 100 in that NOR gates (30 and 31) and inverters (32 and 33) may be included while inverters (24, 25, and 26) of FIG. 1 may be eliminated.

NOR gate 30 may have a first input terminal connected to terminal 14, a second input terminal connected to an output terminal of NOR gate 31, and may have an output terminal connected to a first input terminal of NOR gate 31. NOR gate 31 may have a second input terminal connected to terminal 15 and an output terminal connected to an input terminal of inverter 32. Inverter 32 may have an output connected to terminal F. Inverter 33 may have an input connected to terminal F and an output connected to terminal G.

Transfer gate 28 may include n-channel transistor N26 and p-channel transistor P26. N-channel transistor N26 may have a first source/drain connected to an output of inverter 23, a second source drain connected to output terminal Y, and a gate connected to terminal G. P-channel transistor P26 may have a first source/drain connected to an output of inverter 23, a second source drain connected to output terminal Y, and a gate connected to terminal F.

Transfer gate 29 may include n-channel transistor N27 and p-channel transistor P27. N-channel transistor N27 may have a first source/drain connected to terminal 15, a second source drain connected to output terminal Y, and a gate connected to terminal F. P-channel transistor P27 may have a first source/drain connected to terminal 15, a second source drain connected to output terminal Y, and a gate connected to terminal G.

In this way, level shift circuit 800 may include advantages of reducing the possibility of glitches at output terminal Y in a similar manner to level shift circuit 700 described above.

Level shift circuits (100, 300, 500, and 700) may provide an output signal at an output terminal Y that is inverted with respect to an input signal at an input terminal A. However, the logic may be changed so that an output signal at an output terminal Y that is not inverted with respect to an input signal at an input terminal A. This may be accomplished, for example, by placing inverter 23 between terminal 15 and clocked inverter 22 instead of between terminal 14 and clocked inverter 21. Also, in this case, the number of logic gates in which a rising edge signal at input terminal A propagates through may more closely match the number of logic gates in which a rising edge signal at input terminal A passes through before providing an output signal at output terminal Y. In this way, a delay time difference may be further reduced.

According to the embodiments, a level shift circuit may include a level shift portion and a signal selection portion. A level shift portion may receive an input signal and provide complementary level shifted signals. A signal selection circuit may select one of the complementary signals to provide a timing for an output signal. In this case, a falling one of the complementary signals may be selected. In this way, a timing of an output signal may be consistent for both a rising edge output signal and a falling edge output signal as compared to the received input signal.

By doing so, it may be possible to reduce the difference between input-output delay times to 50% or less as compared to a conventional level shift circuit. Also, if a first power supply potential and a second power supply potential fluctuate, it may be possible to reduce a range between a maximum value and minimum value of an input-output delay time in comparison with the case of a conventional level shift circuit.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A level shift circuit that is supplied with a first power supply potential, a second power supply potential, and a reference potential and converts an input signal having a first potential swing essentially corresponding to a potential difference between the first power supply potential and the reference potential into an output signal having a second potential swing essentially corresponding to a potential difference between the second power supply potential and the reference potential, comprising:

a level shift portion coupled to receive the input signal and generating first and second signals having the second potential swing and complementary logic levels, the second potential awing being greater than the first potential swing;

a signal selection portion coupled to receive the first and second signals and providing the output signal having a transition based on the first signal when the first signal transitions from a high logic level to a low logic level and based on the second signal when the second signal transitions from the high logic level to the low logic level;

wherein the level shift portion includes;

the first signal being received at a first node and the second signal being received at a second node;

a first inverter supplied with the first power supply potential and the reference potential the first inverter is coupled to receive the input signal and generating an inverted signal having the first potential swing;

a first p-channel transistor having a source coupled to receive the second power supply potential, a gate coupled to the second node, and a drain coupled to the first node;

a second p-channel transistor having a source coupled to receive the second power supply potential a gate coupled to the first node, and a drain coupled to the second node;

a first n-channel transistor having a drain coupled to die first node, a gate coupled to receive the inverted signal, and a source coupled to the reference potential; and a second n-channel translator having a drain coupled to the second node, a gate coupled to receive the input signal and a source coupled to the reference potential.

2. The level shift circuit according to claim 1, wherein the level shift portion further includes:

a third p-channel transistor that couple, the drain of the first p-channel transistor to the first node and a gate coupled to receive a third power supply potential; and a fourth p-channel transistor that couples the drain of the second p-channel transistor to the second node and a gate coupled to receive the third power supply potential.

3. The level shifter circuit according to claim 1, wherein the signal selection portion includes:

an output terminal receiving the output signal;

a first inverter supplied with the second power supply potential and having a first inverter input and first inverter output, the first inverter input coupled to receive the first signal;

a first clocked inverter supplied with the second power supply potential and coupled to receive the first inverter output at a first clocked inverter input and a first control signal at a first clocked inverter control terminal and having a first clocked inverter output coupled to the output terminal;

a second clocked inverter supplied with the second power supply potential and coupled to receive the second signal at a second clocked inverter input and the first control signal at a second clocked inverter control terminal and having a second clocked inverter output coupled to the output terminal; and a logic circuit generating the first control signal wherein the first clocked inverter is in an operation state when the first signal has a high logic level and the second clocked inverter is placed in the operation state a predetermined time after the first signal transitions to the low logic level and the second clocked inverter is in the operation state when the second signal has a high loge level and the first clocked inverter is placed in the operation state a predetermined time alter the second signal transitions to the low logic level.

4. The level shift circuit according to claim 3, wherein:

the first clocked inverter includes a first p-channel transistor having a source coupled to the second power supply potential, a gate coupled to receive the first control signal, and a drain coupled to a source of a second p-channel transistor;

the second p-channel transistor having a gate coupled to the first inverter output and a drain coupled to the output terminal;

a first n-channel transistor having a drain coupled to the output terminal, a gate coupled to the first inverter output, and a source coupled to a drain of a second n-channel transistor;

the second n-channel transistor having a gate coupled to a second control signal and a source coupled to the reference potential; the second clocked inverter includes a third p-channel transistor having a source coupled to the second power supply potential, a gate coupled to receive the second control signal, and a drain coupled to the source of a fourth p-channel transistor;

the fourth p-channel transistor having a gate coupled to receive the second signal and a drain coupled to the output terminal;

a third n-channel transistor having a drain coupled to the output terminal, a gate coupled to receive the second signal, and a source coupled to a drain of a fourth n-channel transistor; and the fourth n-channel transistor having a gate coupled to receive the first control signal and a source coupled to the reference potential.

5. The level shift circuit according to claim 1, wherein:

the signal selection portion includes an output terminal providing the output signal;

a first inverter supplied with the second power supply potential and having a first inverter input and first inverter output, the first inverter input coupled to receive the first signal;

a first transfer gate coupled between the first inverter output and the output terminal and having a first transfer gate control terminal coupled to receive a first control signal; and a second transfer gate coupled between the second signal terminal and the output terminal and having a second transfer gate control terminal coupled to receive the first control signal.

6. The level shift circuit according to claim 5, wherein:

the first transfer gate includes a first p-channel transistor having a first source/drain terminal coupled to receive the first Inverter output, a second source/drain terminal coupled to the output terminal, and a gate coupled to receive the first control signal;

a first n-channel transistor having a first source/drain terminal coupled to receive the first invader output, a second source/drain terminal coupled to the output terminal, and a gate coupled to receive a second control signal;

the second transfer gate includes a second p-channel transistor having a first source/drain terminal coupled to receive the second signal, a second source/drain terminal coupled to the output terminal, and a gate coupled to receive the second control signal; and a second n-channel transistor having a first source/drain terminal coupled to receive the second signal, a second source/drain terminal coupled to the output terminal, and a gate coupled to receive the first control signal.

7. A level shift circuit, comprising:

a level shift portion coupled to receive an input signal and generating first and second signals;

a signal selection portion including a first signal path circuit coupled to receive the first signal and provide en output signal in response to the first signal transitioning from a first logic level to a second logic level and a second signal path circuit coupled to receive the second signal and provide the output signal in response to the second signal transitioning from the first logic level to the second logic level; and a control circuit coupled to provide a control signal to the first signal path circuit and the second signal path circuit, the control circuit coupled to receive the output signal wherein the first signal path is enabled in response to the output signal having a first output signal logic level and the second signal path is enabled in response to the output signal having a second output signal logic level.

8. The level shift circuit according to claim 7, further including:

the first signal path is enabled in response to the first signal having the first logic level and the second signal having the second logic level and the second signal path is enabled in response to the second signal having the first logic level and the first signal having the second logic level.

9. The level shift circuit according to claim 8, wherein:

the control circuit includes a flip-flop coupled to receive the first signal and the second signal.

10. The level shift circuit according to claim 7, wherein:

the first signal has a first transition time for the first logic level to the second logic level transition and a second transition time fix the second logic level to the first logic level transition and the second transition time is greater than the first transition time.

11. The level shift circuit according to claim 7, wherein:

the first signal path circuit includes a first clocked inverter; and the second signal path circuit includes a second clocked inverter.

12. The level shift circuit according to claim 7, wherein:

the first signal path circuit includes a first transfer gate; and the second signal path circuit includes a second transfer gate.

13. A level shift circuit, comprising:

a level shift portion coupled to receive an input signal having a first voltage swing and generating first and second signals having a second voltage swing greater than the first voltage swing;

a signal selection portion including a first signal path circuit coupled to receive the first signal and provide an output signal in response to the first signal transitioning from a first logic level to a second logic level and a second signal path circuit coupled to receive the second signal and provide the output signal in response to the second signal transitioning from the first logic level to the second logic level; and a control circuit coupled to provide a signal path control signal to the first signal path circuit and the second signal path circuit; wherein the output signal makes a first logic transition in response to the first signal transitioning from a first logic level to a second logic level and the control signal enables the second signal path circuit and disables the first signal path circuit after the first transition and the output signal makes a second logic transition in response to the second signal transitioning from the first logic level to the second logic level and the control signal enables the first signal path circuit and disables the second signal path circuit after the second transition.

14. The level shift circuit, according to claim 13, further including:

to control circuit coupled to receive to output signal;

the first signal path circuit including a first clocked inverter coupled to receive the signal path control signal; and the second signal path circuit including a second clocked inverter coupled to receive the signal path control signal.

15. The level shift circuit, according to claim 13, further including:

the control circuit coupled to receive the output signal;

to first signal path circuit including a first transfer gate coupled to receive the signal path control signal; and the second signal path circuit including a second transfer gate coupled to receive the signal path control signal.

16. The level shift circuit according to further including:

the control circuit coupled to receive the first signal and the second signal;

the first signal path circuit including a first clocked inverter coupled to receive to signal path control signal; and the second signal path circuit including a second clocked inverter coupled to receive the signal path control signal.

17. The level shift circuit according to claim 13, wherein:

the control circuit coupled to receive the first signal and the second signal;

the first signal path circuit including a first transfer gate coupled to receive the signal path control signal; and the second signal path circuit including a second transfer gate coupled to receive the signal path control signal.

* * * * *